United States Patent
Hwang et al.

(10) Patent No.: US 7,447,097 B2
(45) Date of Patent: Nov. 4, 2008

(54) TRAS ADJUSTING CIRCUIT FOR SELF-REFRESH MODE IN A SEMICONDUCTOR DEVICE

(75) Inventors: Mi Hyun Hwang, Kyoungki-do (KR); Shin Ho Chu, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 46 days.

(21) Appl. No.: 11/648,270

(22) Filed: Dec. 29, 2006

(65) Prior Publication Data

US 2007/0274146 A1    Nov. 29, 2007

(30) Foreign Application Priority Data

May 23, 2006    (KR) .................. 10-2006-0046186

(51) Int. Cl.
    *G11C 7/00*    (2006.01)
(52) U.S. Cl. .................. 365/222; 365/193; 365/230.06
(58) Field of Classification Search ................ 365/222, 365/236, 193, 194, 230.06, 189.07, 189.09
    See application file for complete search history.

(56) References Cited

U.S. PATENT DOCUMENTS

| | | | | |
|---|---|---|---|---|
| 5,566,117 A | * | 10/1996 | Okamura et al. | ............. 365/222 |
| 6,404,687 B2 | * | 6/2002 | Yamasaki | .................... 365/222 |
| 6,912,169 B2 | * | 6/2005 | Choi | ........................... 365/222 |
| 7,286,377 B1 | * | 10/2007 | Pyeon | .......................... 365/22 |

FOREIGN PATENT DOCUMENTS

| | | |
|---|---|---|
| KR | 1020030000479 | 1/2003 |
| KR | 1020030052359 | 6/2003 |
| KR | 1020040091980 | 11/2004 |
| KR | 1020050067449 | 7/2005 |
| KR | 1020050106833 | 11/2005 |

OTHER PUBLICATIONS

Notice of Patent Grant mailed Jan. 3, 2008 for the corresponding KR10-2006-0046186.

* cited by examiner

*Primary Examiner*—Gene N. Auduong
(74) *Attorney, Agent, or Firm*—Ladas & Parry LLP

(57) ABSTRACT

A tRAS adjusting circuit extends an active operation in a self-refresh operation. The tRAS adjusting circuit includes: a self-refresh sensing unit for receiving a self-refresh signal and a refresh signal and generating a sensing signal; a first extension unit for extending an enable interval of an active operation pulse; a second extension unit for extending an enable interval of an output signal of the first extension unit; a transfer unit for transferring either the output signal of the first extension unit or an output signal of the second extension unit as a tRAS signal according to an enable state of the sensing signal; and an active signal output unit for receiving the active operation pulse and tRAS signal and outputting an enable state of the active operation pulse as an active signal until the tRAS signal is disabled.

20 Claims, 3 Drawing Sheets

TRAS ADJUSTING CIRCUIT FOR SELF-REFRESH MODE IN A SEMICONDUCTOR DEVICE

CROSS-REFERENCE TO RELATED APPLICATIONS

The present application claims priority to patent application number 10-2006-0046186 filed on May 23, 2006, which is incorporated herein by reference in its entirety.

BACKGROUND OF THE INVENTION

The present invention relates to a semiconductor memory device, and more particularly to a tRAS adjusting circuit for extending an active operation in a self-refresh mode.

As generally known in the art, a dynamic random access memory (DRAM) is a volatile memory device including a plurality of cells, each of which contains one transistor and one capacitor.

Since the charge stored in a memory cell capacitor is drained as junction leakage current of a storage node and data are destroyed, a refresh operation must be periodically performed to maintain data stored in the memory cell.

A semiconductor memory device supports a self-refresh mode so as to maintain data stored therein. In the self-refresh mode, all input pins except for a clock enable pin are deactivated, and not only a refresh address but also a refresh signal is generated in the semiconductor memory device.

When entering a self-refresh mode, the semiconductor memory device repeatedly performs an active operation and a precharge operation therein according to a refresh cycle. Herein, the active operation refers to a process of selecting a word line and amplifying cell data, and the precharge operation refers to a process of isolating a memory cell having restored cell data and initializing a bit-line sense amplifier so as to enable the next active operation.

Meanwhile, in the conventional semiconductor memory device for low-power mobile goods, when a refresh operation is performed in a self-refresh mode, a precharge operation may be performed before memory cell data is sufficiently amplified by a bit-line sense amplifier.

That is, in the conventional semiconductor memory device for low-power mobile goods, a longer time than that for a normal operation is required for a bit-line sense amplifier to sufficiently amplify cell data in a self-refresh mode. However, since the conventional semiconductor memory device for low-power mobile goods establishes tRAS, which determines a precharge execution start time, to a level equal to that for a normal operation, data stored in a cell memory may be lost.

SUMMARY OF THE INVENTION

Accordingly, the present invention has been made to solve the above-mentioned and other problems occurring in the prior art, and the present invention provides novel ways to sufficiently secure an active operation interval by extending a tRAS signal to determine a precharge execution start time in a self-refresh mode.

In order to accomplish this, there is provided a tRAS adjusting circuit including: a self-refresh sensing unit for receiving a self-refresh signal and a refresh signal, and for generating a sensing signal; a first extension unit for extending an enable interval of an active operation pulse by a first interval and then outputting the active operation pulse; a second extension unit for extending an enable interval of an output signal outputted from the first extension unit by a second interval, and then outputting a resultant signal as a tRAS signal; a transfer unit for transferring either the output signal of the first extension unit or an output signal of the second extension unit as a tRAS signal according to an enable state of the sensing signal; and an active signal output unit for receiving the active operation pulse and the tRAS signal transferred from the transfer unit, and outputting an enable state of the active operation pulse as an active signal until the tRAS signal is disabled. Herein, the enable interval of the active operation pulse may be a high interval of the active operation pulse.

Preferably, the self-refresh sensing unit enables the sensing signal when the self-refresh signal is enabled.

Preferably, the self-refresh sensing unit disables the sensing signal, when the self-refresh signal is disabled and the refresh signal is disabled.

In addition, the self-refresh sensing unit includes: a NOR gate for receiving the self-refresh signal and the refresh signal and performs a NOR operation on the received signals; a first inverter for inverting the phase of the self-refresh signal; a second inverter for inverting the phase of an output signal of the NOR gate; and a first latch unit for receiving an output signal of the first inverter and an output signal of the second inverter, and latching and outputting an enable state of the self-refresh signal as the sensing signal until the refresh signal is disabled.

Preferably, the first latch unit comprises a first NAND gate and a second NAND gate, in which: the first NAND gate receives the output signal of the first inverter and an output signal of the second NAND gate, performs a NAND operation on the received signals, and outputs a resultant signal as the sensing signal; and the second NAND gate receives the output signal of the second inverter and an output signal of the first NAND gate, performs a NAND operation on the received signals, and outputs a resultant signal to the first NAND gate.

Also, the first extension unit comprises an RC delay circuit for delaying a falling edge of the active operation pulse.

Preferably, the first extension unit sets the first interval to an interval corresponding to a tRAS time interval set at the time of a normal operation.

Also, the second extension unit comprises an RC delay circuit for delaying a falling edge of the output signal of the first extension unit.

Preferably, the second extension unit sets the second interval to a time interval from a time point when a voltage stored in a memory cell is amplified by the bit-line sense amplifier during the first interval to a time point until when the stored voltage is amplified up to at least 95% of a data voltage.

Preferably, the sensing signal is disabled, the transfer unit transfers a tRAS signal outputted from the first extension unit.

Preferably, the transfer unit includes: a third inverter for inverting the phase of the sensing signal; a first transfer unit for transferring the output signal of the second extension unit as a tRAS signal when the sensing signal is enabled; and a second transfer unit for transferring the output signal of the first extension unit as a tRAS signal when the sensing signal is disabled.

Preferably, the first transfer unit includes a first transfer gate including a first PMOS transistor and a first NMOS transistor; the second transfer unit includes a second transfer gate including a second PMOS transistor and a second NMOS transistor; a gate of the first PMOS transistor and a gate of the second NMOS transistor are connected in common and receive an output signal of the third inverter; and a gate of the first NMOS transistor and a gate of the second PMOS transistor receive the sensing signal.

Preferably, the active signal output unit includes: a fourth inverter for inverting the phase of the active operation pulse; and a second latch unit including a third NAND gate and a fourth NAND gate, in which the third NAND gate receives an output signal of the fourth inverter and an output signal of the fourth NAND gate, performs a NAND operation on the received signals, and outputs a resultant signal as the active signal; and the fourth NAND gate receives the tRAS signal and an output signal of the third NAND gate, performs a NAND operation on the received signals, and outputs a resultant signal to the third NAND gate.

BRIEF DESCRIPTION OF THE DRAWINGS

The objects, features, and advantages of the present invention will be more apparent from the following detailed description taken in conjunction with the accompanying drawings, in which.

DETAILED DESCRIPTION OF THE PREFERRED EMBODIMENTS

Figure 1:
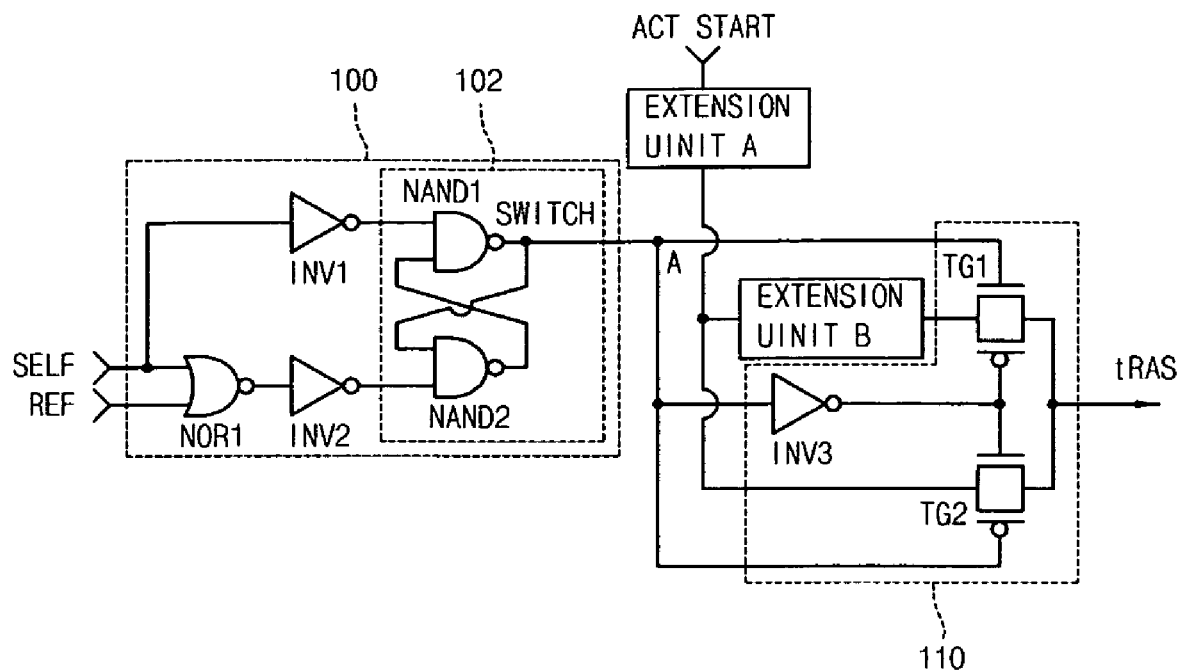
FIG. 1 is a circuit diagram illustrating the construction of a tRAS adjusting circuit according to a first embodiment of the preset invention.

Hereinafter, preferred embodiments of the present invention will be described with reference to the accompanying drawings. In the following description and drawings, the same reference numerals are used to designate the same or similar components, and so repetition of the description on the same or similar components will be omitted.

As shown in FIG. 1, a tRAS adjusting circuit according to a first embodiment of the present invention includes a self-refresh sensing unit 100, extension unit A, extension unit B and a transfer unit 110.

The self-refresh sensing unit 100 receives a self-refresh signal "SELF" and a refresh signal "REF", and generates and transmits a sensing signal "SWITCH" to the transfer unit 110. Herein, the self-refresh signal "SELF" is enabled when a self-refresh entry command is inputted from the exterior, and is disabled when a self-refresh exit command is inputted from the exterior.

In a synchronous semiconductor memory device, the self-refresh entry command and the self-refresh exit command may be determined by decoding control signals (e.g., /CS, /RAS, /CAS, /WE and /CKE) inputted from the exterior of the semiconductor memory device.

Also, the refresh signal "REF" is enabled in order to refresh a memory cell of the semiconductor memory device at a predetermined period when the semiconductor memory device enters the self-refresh mode. It is preferred that the predetermined interval is less than a interval of time during which an isolated cell maintains a charge quantity required to be normally amplified by a bit-line sense amplifier. The sensing signal "SWITCH" is a signal to control the turn-on/turn-off of the transfer unit 110.

The self-refresh sensing unit 100 may include a NOR gate NOR1, two inverters INV1 and INV2, and a latch unit 102.

The NOR gate NOR1 receives a self-refresh signal "SELF" and a refresh signal "REF", and performs the NOR operation on the self-refresh signal "SELF" and the refresh signal "REF". The inverter INV1 receives the self-refresh signal "SELF" and inverts the phase of the self-refresh signal "SELF", and the inverter INV2 receives an output signal of the NOR gate NOR1 and inverts the phase of the output signal. The latch unit 102 receives an output signal of the inverter INV1 and an output signal of the inverter INV2, and latches and outputs an enable state of the self-refresh signal "SELF" as a sensing signal "SWITCH" until the refresh signal "REF" is disabled.

Preferably, the latch unit 102 includes two NAND gates NAND1 and NAND2, and is constructed in such a manner that the output signal of one NAND gate is inputted to an input terminal of the other NAND gate. That is, the NAND gate NAND1 receives an output signal of the inverter INV1 and an output signal of the NAND gate NAND2, and performs the NAND operation on the two received signals, thereby outputting a result of the NAND operation as a sensing signal "SWITCH". The NAND gate NAND2 receives an output signal of the inverter INV2 and an output signal of the NAND gate NAND1, and performs the NAND operation on the two received signals, thereby outputting a result of the NAND operation to an input terminal of the NAND gate NAND1.

The self-refresh sensing unit 100 having the aforementioned construction enables the sensing signal "SWITCH" when the self-refresh signal "SELF" is enabled. Also, when the self-refresh signal "SELF" is disabled and the refresh signal "REF" is disabled, the self-refresh sensing unit 100 can disable the sensing signal "SWITCH".

The extension unit A extends the high period of an active operation pulse "ACT START" by an "A" period, and then outputs the active operation pulse "ACT START". The "A" period refers to a tRAS time period when the semiconductor memory device performs a normal operation. Herein, the tRAS represents a time interval from the starting point of an active operation to the starting of a precharge operation. That is, the tRAS is a time interval required until sufficient charge is restored in a memory cell in an active operation.

In order to extend the high interval of an active operation pulse "ACT START" by an "A" interval and to output the active operation pulse "ACT START", it is preferred that the extension unit A includes an RC delay circuit to delay the falling edge of the active operation pulse "ACT START".

The extension unit B extends the high interval of an output signal of the extension unit A by a "B" period, and then outputs the output signal of the extension unit A as a tRAS signal. The "B" period refers to a time interval required for a voltage stored in a memory cell to be sufficiently amplified by a bit-line sense amplifier.

That is, preferably, the "B" period is set to be longer than a time interval from the time point when the voltage stored in a memory cell is amplified by the bit-line sense amplifier during the "A" interval to the time point when the stored voltage is amplified up to 95% of a data voltage.

In order to extend the high interval of an output signal of the extension unit A by a "B" interval and to output the resultant signal, it is preferred that the extension unit B includes an RC delay circuit to delay the falling edge of the output signal of the extension unit A.

The transfer unit 110 transmits an output signal of the extension unit B as a tRAS signal when the sensing signal "SWITCH" is enabled, and transmits an output signal of the extension unit A as a tRAS signal when the sensing signal "SWITCH" is disabled.

The transfer unit 110 may include an inverter INV3 and two transfer gates TG1 and TG2. The inverter INV3 receives the sensing signal "SWITCH", and then outputs the sensing signal "SWITCH" after inverting the phase of the sensing signal "SWITCH".

The transfer gate TG1 transfers the output signal of the extension unit B as a tRAS signal when the sensing signal "SWITCH" is enabled. The transfer gate TG2 transfers the output signal of the extension unit A as a tRAS signal when, the sensing signal "SWITCH" is disabled.

Preferably, each of the transfer gates TG1 and TG2 contains a CMOS transfer gate, which includes a PMOS transistor and an NMOS transistor. In this case, the gate of a PMOS transistor in the transfer gate TG1 and the gate of an NMOS transistor in the transfer gate TG2 are connected to each other, and receive the output signal of the inverter INV3. In addition, the sensing signal "SWITCH" is applied to both the gate of an NMOS transistor in the transfer gate TG1 and the gate of a PMOS transistor in the transfer gate TG2.

The tRAS adjusting circuit according to the first embodiment of the present invention may further include an active signal output unit 120. The active signal output unit 120 receives an active operation pulse "ACT START" and a tRAS signal transmitted from the transfer gates TG1 and TG2, and latches and outputs an enable state "high" of the active operation pulse "ACT START" as an active signal "ACT" until the tRAS signal is disabled.

Figure 2:
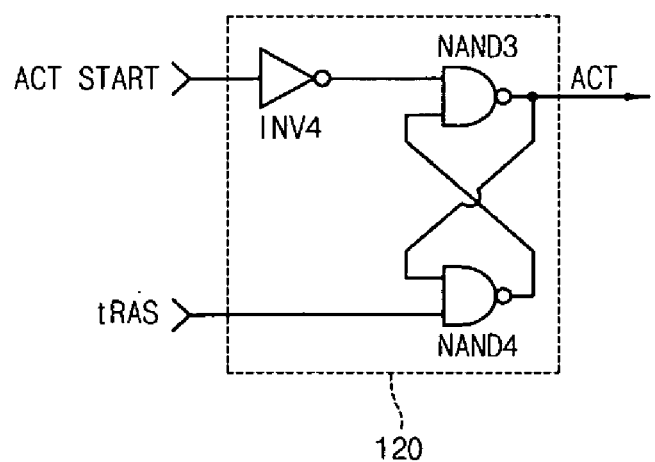
FIG. 2 is a circuit diagram illustrating the construction of an active signal output unit in the tRAS adjusting circuit of FIG. 1.

The construction of the active signal output unit will now be described with reference to FIG. 2. The active signal output unit 120 may include an inverter INV4, and two NAND gates NAND3 and NAND4.

The inverter INV4 receives the active operation pulse "ACT START", inverts the phase of the active operation pulse "ACT START", and outputs the phase-inverted active operation pulse "ACT START". The two NAND gates NAND3 and NAND4 are constructed in such a manner that the output signal of one NAND gate is inputted to an input terminal of the other NAND gate, thereby performing a latch function.

That is, the NAND gate NAND3 receives the output signal of the inverter INV4 and the output signal of the NAND gate NAND4, performs the NAND operation on the two received signals, and outputs the resultant signal as an active operation pulse "ACT START". The NAND gate NAND4 receives a tRAS signal and the output signal of the NAND gate NAND3, performs the NAND operation on the two received signals, and outputs the resultant signal to an input terminal of the NAND gate NAND3.

In a self-refresh mode, the active operation pulse "ACT START" outputted from the active signal output unit 120 determines a precharge entry time point after an active operation. That is, when the active operation pulse "ACT START", having been enabled, is disabled, a precharge operation can be performed.

Therefore, according to the tRAS adjusting circuit based on the first embodiment of the present invention, the enable interval of an active signal is extended through the extension unit A and extension unit B so that data of a memory cell can be sufficiently amplified before a precharge operation is performed, thereby securing a stable operation even in a semiconductor memory device for low-power mobile goods.

Figure 3:
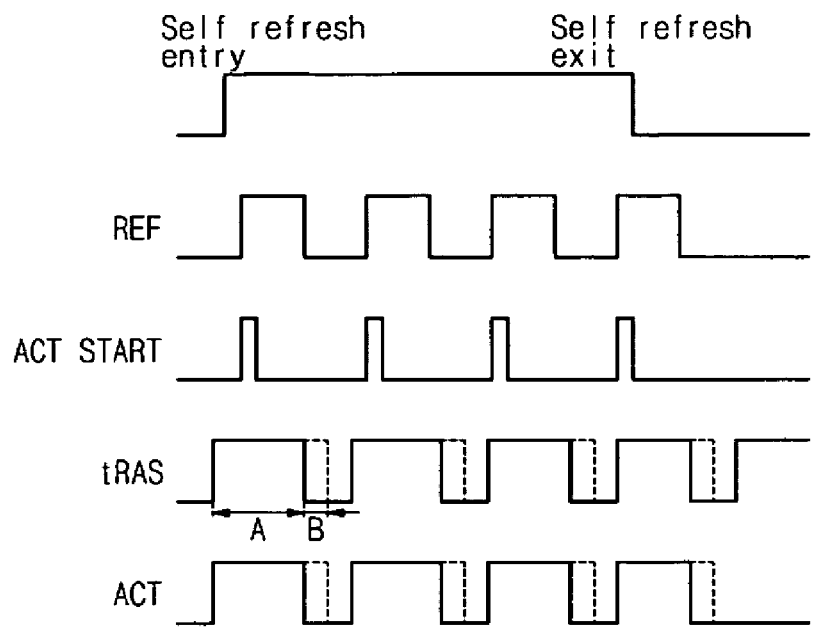
FIG. 3 is a waveform view for explaining the operation of the tRAS adjusting circuit shown in FIG. 1.

FIG. 3 is a waveform view for explaining the operation of the tRAS adjusting circuit shown in FIG. 1. As shown in FIG. 3, when the self-refresh signal "SELF" is enabled, the sensing signal "SWITCH" output through node A is latched in a "high" state, regardless of the state of the refresh signal "REF". Accordingly, the transfer gate TG1 is turned on, and the transfer gate TG2 is turned off.

Meanwhile, the active operation pulse "ACT START" enabled together with the refresh signal "REF" is inputted to the NAND gate NAND3 of the active signal output unit 120 through the inverter INV4, and latches the active signal "ACT", which is the output of the NAND gate NAND3, in a "high" state.

In addition, the falling edge of the active operation pulse "ACT START" is delayed by the "A" period through the extension unit A, and then is delayed by the "B" period through the extension unit B, so that the active operation pulse "ACT START" is converted into a tRAS signal "tRAS" maintaining a "high" state as long as the "A+B" interval.

When the tRAS signal "tRAS" is shifted to a "low" state at the last point of the "B" interval, the output of the NAND gate NAND4 in the active signal output unit 120 is shifted to a "high" state, and is inputted to the NAND gate NAND3.

At this time, since the active operation pulse "ACT START" is in a "low" state, the NAND gate NAND3 receives an input of a "high" state from the inverter INV4. Accordingly, the active signal "ACT", which is the output of the active signal output unit 120, is shifted to a "low" state.

In other words, according to the tRAS adjusting circuit based on the first embodiment of the present invention, an enable state of the active operation pulse "ACT START" is latched by the active signal output unit 120, thereby maintaining an enable state of the active signal "ACT".

In addition, since the active signal "ACT" is disabled according to the state of a tRAS signal which is extended through the extension unit A and extension unit B, it is possible to extend an enable state of the active signal "ACT", which, together with the tRAS signal, determines a precharge entry time.

Figure 4:
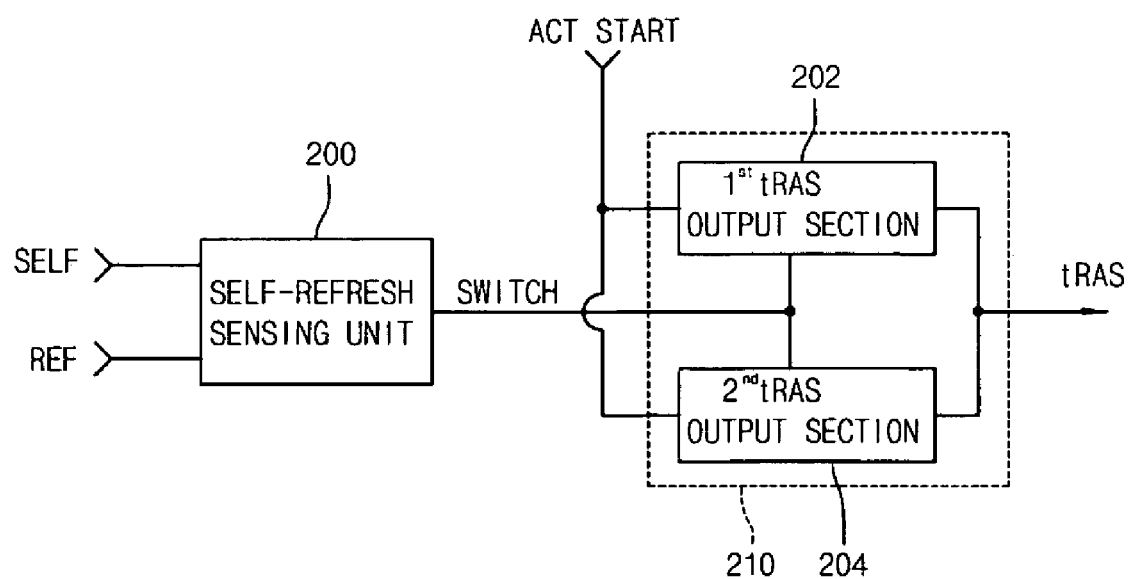
FIG. 4 is a block diagram illustrating the construction of a tRAS adjusting circuit according to a second embodiment of the present invention.

FIG. 4 is a block diagram illustrating the construction of a tRAS adjusting circuit according to a second embodiment of the present invention. As shown in FIG. 4, the tRAS adjusting circuit according to the second embodiment of the present invention includes a self-refresh sensing unit 200 and a tRAS extension unit 210. The self-refresh sensing unit 200 may have the same construction as the self-refresh sensing unit 100 described with reference to FIG. 1, so a detailed description thereof will be omitted.

The tRAS extension unit 210 includes a first tRAS output section 202 for outputting a first tRAS signal in response to a sensing signal "SWITCH", and a second tRAS output section 204 for outputting a second tRAS signal in response to the sensing signal "SWITCH".

Figure 5:
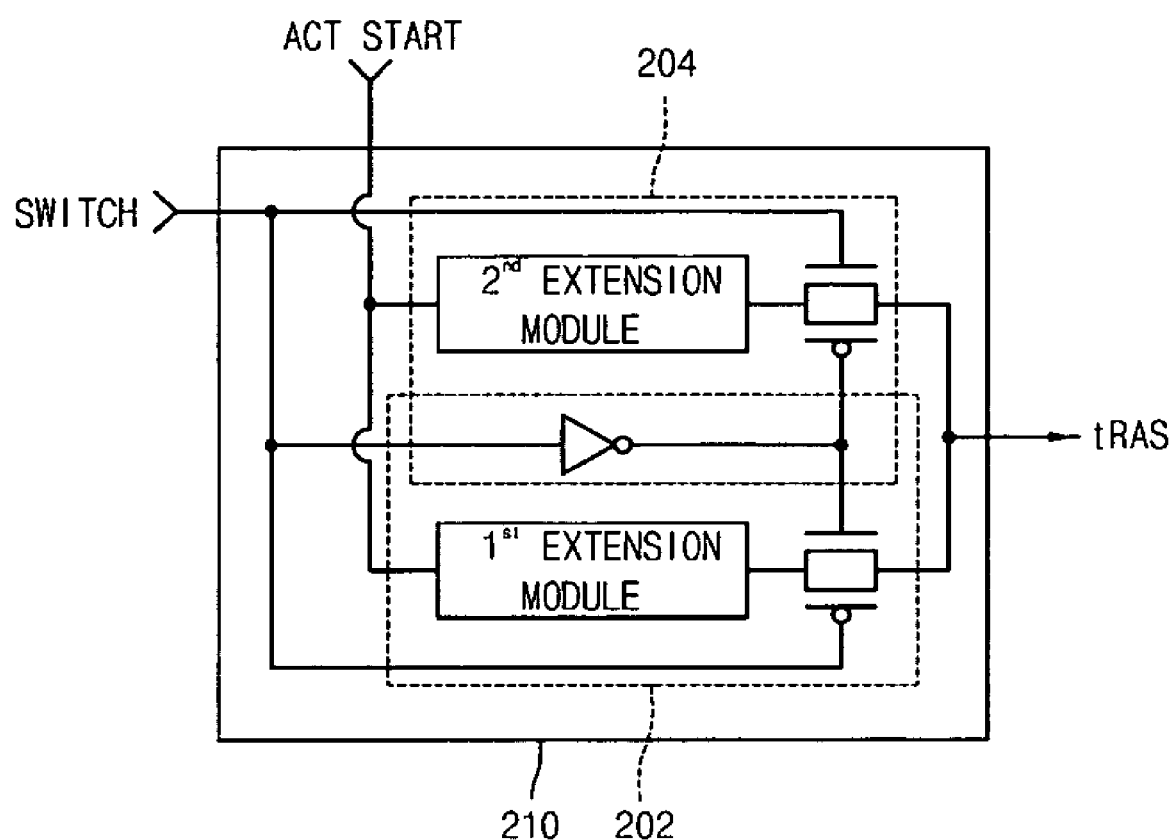
FIG. 5 is a block diagram illustrating the construction of the tRAS extension unit in the tRAS adjusting circuit of FIG. 4.

The construction and operation of the first and second tRAS output sections 202 and 204 will now be described in more detail with reference to FIG. 5. FIG. 5 is a block diagram illustrating the construction of the tRAS extension unit in the tRAS adjusting circuit according to the second embodiment of the present invention.

As shown in FIG. 5, the first tRAS output section 202 includes a first extension module, an inverter INV13 and a transfer gate TG12, and the second tRAS output section 204 includes a second extension module, the inverter INV13 and a transfer gate TG11. Herein, the inverter INV13 may be used in common for the first tRAS output section 202 and second tRAS output section 204.

The first extension module outputs an active operation pulse "ACT START" after extending the "high" interval of the active operation pulse "ACT START" by a first time interval. The first time interval corresponds to a tRAS time interval required when a semiconductor memory device performs a normal operation, which is the same as the "A" interval described in the first embodiment of the present invention. Preferably, the first extension module includes an RC delay circuit to delay the falling edge of an active operation pulse "ACT START".

The second extension module outputs the active operation pulse "ACT START" after extending the "high" interval of the active operation pulse "ACT START" by a second time interval. The second time interval represents a time interval obtained by adding a tRAS time interval required when a semiconductor memory device performs a normal operation to a time interval which allows a voltage stored in a memory cell to be sufficiently amplified by a bit-line sense amplifier.

That is, the second time interval corresponds to a time interval obtained by adding the "A" interval to the "B" interval, which are described in the first embodiment of the present invention. Therefore, it is preferred that the second time interval is longer than a time interval from the point in time when a voltage stored in a memory cell is amplified by the bit-line sense amplifier to the point in time when the stored voltage is amplified up to 95% of a data voltage. Also, it is preferred that the second extension module includes an RC delay circuit to delay the falling edge of an active operation pulse "ACT START".

Hereinafter, the operation of the tRAS extension unit 210 in the tRAS adjusting circuit according to the second embodiment of the present invention will be described. First, when a sensing signal "SWITCH" having a "high" state is outputted from the self-refresh sensing unit 200, the transfer gate TG11 is turned on, and the transfer gate TG12 is turned off.

In this case, the falling edge of an active operation pulse "ACT START" is delayed by the second time interval through the second extension module, thereby outputting a tRAS signal maintaining a "high" state for the same length of time as the second time interval.

That is, in a self-refresh mode, the enable period of a tRAS signal is extended by the second time interval. Accordingly, it is possible to sufficiently secure an active operation interval in a self-refresh mode by using the active signal output unit described in the first embodiment of the present invention.

Meanwhile, when a sensing signal "SWITCH" having a "low" state is outputted from the self-refresh sensing unit 200, the transfer gate TG11 is turned off, and the transfer gate TG12 is turned on.

In this case, the falling edge of an active operation pulse "ACT START" is delayed by the first time period through the first extension module, thereby outputting a tRAS signal which maintains a "high" state for the same time length as the first time interval. That is, in modes other than the self-refresh mode, the tRAS signal has an enable interval required for a normal operation.

With the construction and operation of the tRAS adjusting circuits according to the aforementioned embodiments of the present invention, those skilled in the art may analogize the construction and operation of other various tRAS adjusting circuits based on the present invention, so a detailed description thereof will be omitted.

As described above, the tRAS adjusting circuit according to the present invention can secure a sufficient active operation period by extending a tRAS signal to determine a precharge execution start time in a self-refresh mode, so that it is possible to secure a stable self-refresh operation in a semiconductor memory device for low-power mobile goods.

Although preferred embodiments of the present invention are described for illustrative purposes, those skilled in the art will appreciate that various modifications, additions and substitutions are possible, without departing from the scope and spirit of the invention as disclosed in the accompanying claims.

What is claimed is:

1. A tRAS adjusting circuit comprising:
   a self-refresh sensing unit for receiving a self-refresh signal and a refresh signal, and for generating a sensing signal;
   a first extension unit for extending an enable interval of an active operation pulse by a first interval and then outputting the extended active operation pulse;
   a second extension unit receiving the extended active operation pulse outputted from the first extension unit, and extending an enable interval of the extended active operation pulse outputted from the first extension unit by a second interval and then outputting the resulting signal; and
   a transfer unit for transferring either the output signal of the first extension unit or the output signal of the second extension unit as a tRAS signal according to an enable state of the sensing signal.

2. The tRAS adjusting circuit as claimed in claim 1, further comprising an active signal output unit, which receives the active operation pulse and the tRAS signal transferred from the transfer unit, and outputs an enable state of the active operation pulse as an active signal until the tRAS signal is disabled.

3. The tRAS adjusting circuit as claimed in claim 1, wherein the self-refresh sensing unit enables the sensing signal when the self-refresh signal is enabled.

4. The tRAS adjusting circuit as claimed in claim 3, wherein the self-refresh sensing unit disables the sensing signal, when the self-refresh signal is disabled and the refresh signal is disabled.

5. The tRAS adjusting circuit as claimed in claim 4, wherein the self-refresh sensing unit comprises:
   a NOR gate for receiving the self-refresh signal and the refresh signal and performs a NOR operation on the received signals;
   a first inverter for inverting the phase of the self-refresh signal;
   a second inverter for inverting the phase of an output signal of the NOR gate; and
   a first latch unit for receiving an output signal of the first inverter and an output signal of the second inverter, and latching and outputting an enable state of the self-refresh signal as the sensing signal until the self-refresh signal and the refresh signal are disabled.

6. The tRAS adjusting circuit as claimed in claim 5, wherein the first latch unit comprises a first NAND gate arid a second NAND gate, in which:
   the first NAND gate receives the output signal of the first inverter and an output signal of the second NAND gate, performs a NAND operation on the received signals, and outputs a resultant signal as the sensing signal; and
   the second NAND gate receives the output signal of the second inverter and an output signal of the first NAND gate, performs a NAND operation on the received signals, and outputs a resultant signal to the first NAND gate.

7. The tRAS adjusting circuit as claimed in claim 1, wherein the first extension unit comprises an RC delay circuit for delaying a falling edge of the active operation pulse.

8. The tRAS adjusting circuit as claimed in claim 7, wherein the first extension unit sets the first interval to a interval corresponding to a tRAS time period established for a normal active operation.

9. The tRAS adjusting circuit as claimed in claim 1, wherein the second extension unit comprises an RC delay circuit for delaying a falling edge of the output signal of the first extension unit.

10. The tRAS adjusting circuit as claimed in claim 9, wherein the second extension unit sets the second interval to a time interval from a point in time when a voltage stored in a memory cell is amplified by the bit-line sense amplifier during the first interval to a point in time when the stored voltage is amplified up to at least 95% of a data voltage.

11. The tRAS adjusting circuit as claimed in claim 1, wherein, when the sensing signal is disabled, the transfer unit transfers a tRAS signal outputted from the first extension unit.

12. The tRAS adjusting circuit as claimed in claim 11, wherein, the transfer unit comprises:
a third inverter for inverting the phase of the sensing signal;
a first transfer unit receiving the output signal of the second extension unit, the sensing signal, and the inverted sensing signal and transferring the output signal of the second extension unit as a tRAS signal when the sensing signal is enabled; and
a second transfer unit receiving the output signal of the first extension unit, the sensing signal, and the inverted sensing signal and transferring the output signal of the first extension unit as a tRAS signal when the sensing signal is disabled.

13. The tRAS adjusting circuit as claimed in claim 12, wherein the first transfer unit comprises a first transfer gate including a first PMOS transistor and a first NMOS transistor;
the second transfer unit comprises a second transfer gate including a second PMOS transistor and a second NMOS transistor;
a gate of the first PMOS transistor and a gate of the second NMOS transistor are connected in common and receive an output signal of the third inverter; and
a gate of the first NMOS transistor and a gate of the second PMOS transistor receive the sensing signal.

14. The IRAS adjusting circuit as claimed in claim 2, wherein the active signal output unit comprises:
a fourth inverter for inverting the phase of the active operation pulse; and
a second latch unit including a third NAND gate and a fourth NAND gate,
in which the third NAND gate receives an output signal of the fourth inverter and an output signal of the fourth NAND gate, performs a NAND operation on the received signals, and outputs a resultant signal as the active signal; and
the fourth NAND gate receives the tRAS signal and an output signal of the third NAND gate, performs a NAND operation on the received signals, and outputs a resultant signal to the third NAND gate.

15. A tRAS adjusting circuit comprising:
a self-refresh sensing unit for outputting a sensing signal in response to an input of a self-refresh signal;
a first tRAS output unit for outputting a first tRAS signal when the sensing signal is disabled, wherein the first tRAS signal is enabled for a time period established for a normal active operation; and
a second tRAS output unit for outputting a second tRAS signal when the sensing signal is enabled, wherein the second tRAS signal is enabled for a time period established for a self-refresh active operation.

16. The tRAS adjusting circuit as claimed in claim 15, wherein:
the first tRAS output comprises a first extension module and a first transfer gate, wherein the first extension module extends an active operation pulse by a first interval established for the normal active operation, and wherein the first transistor gate receives the detection signal, an inverted detection signal, and the output of the first extension module and outputs the first tRAS signal when the detecting signal is disabled;
the second tRAS output unit comprises a second extension module and a second transfer gate, wherein the second extension module extends the active operation pulse by a second interval established for self-refresh active operation, and wherein the second transistor gate receives the detecting signal, the inverted detecting signal, and the output of the second extension module and outputs the second tRAS signal when the detecting signal is enabled.

17. A tRAS adjusting circuit comprising:
a refresh detecting unit for detecting a refresh operation mode, the refresh detecting unit receiving a self-refresh signal and a refresh signal and outputting a detecting signal, wherein the detecting signal is enabled when the self-refresh signal is enabled and wherein the detection signal is disabled when the self-refresh signal and the refresh signal are disabled;
a tRAS adjusting unit for controlling the tRAS in response to the detecting signal.

18. The tRAS adjusting circuit as claimed in claim 17, wherein the tRAS adjusting unit configured to control a pulse width of active operation pulse in response to the detecting signal.

19. The tRAS adjusting circuit as claimed in claim 18, wherein the tRAS adjusting unit configured to extend the active operation pulse in response to the detecting signal.

20. The tRAS adjusting circuit as claimed in claim 17, wherein the refresh detecting unit comprises a latch unit for latching an enable state of the self-refresh signal as the detecting signal until the self-refresh signal and the refresh signal are disabled.

* * * * *